(12) United States Patent
Qiao et al.

(10) Patent No.: US 12,363,819 B2
(45) Date of Patent: Jul. 15, 2025

(54) SYSTEM FOR DRIVING POWER DEVICES

(71) Applicant: Delta Electronics (Shanghai) Co., Ltd., Shanghai (CN)

(72) Inventors: Lifeng Qiao, Shanghai (CN); Dehui Zhang, Shanghai (CN); Jie Zhao, Shanghai (CN); Teng Liu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 798 days.

(21) Appl. No.: 17/691,416

(22) Filed: Mar. 10, 2022

(65) Prior Publication Data

US 2022/0330415 A1    Oct. 13, 2022

(30) Foreign Application Priority Data

Apr. 7, 2021 (CN) .......................... 202110371654.5

(51) Int. Cl.
  *H05K 1/00* (2006.01)
  *H01L 23/367* (2006.01)
  (Continued)

(52) U.S. Cl.
  CPC ......... *H05K 1/0204* (2013.01); *H01L 23/367* (2013.01); *H01L 25/115* (2013.01); *H05K 1/0216* (2013.01)

(58) Field of Classification Search
  CPC .. H05K 1/0204; H05K 1/0216; H01L 23/367; H01L 25/115
  See application file for complete search history.

(56) References Cited

U.S. PATENT DOCUMENTS

| | | | |
|---|---|---|---|
| 2011/0069455 A1* | 3/2011 | Tokuyama | ......... H05K 7/20927 361/702 |
| 2011/0211152 A1 | 9/2011 | Hirabayashi | |

(Continued)

FOREIGN PATENT DOCUMENTS

| | | |
|---|---|---|
| CN | 101960707 A | 1/2011 |
| CN | 202068340 U | 12/2011 |

(Continued)

*Primary Examiner* — Pete T Lee
(74) *Attorney, Agent, or Firm* — KIRTON McCONKIE; Evan R. Witt

(57) ABSTRACT

A system for driving power devices is provided, and the system includes a heat dissipation plate, semiconductor modules, gate plates, a control board, a bridge module, and a terminal module. The semiconductor modules are disposed on the heat dissipation plate. Each gate plate is disposed on the corresponding semiconductor module and includes first driving terminal. The control board is disposed on the heat dissipation plate. The bridge module and the terminal module are electrically connected to each other, disposed on the control board, and arranged sequentially in a direction from a center to an edge of the control board. The bridge module includes a plurality of driving bridge plates, and each driving bridge plate is electrically coupled to the control board. The terminal module includes a plurality of second driving terminals, and each second driving terminal is electrically connected to the corresponding driving bridge plate and first driving terminal.

28 Claims, 14 Drawing Sheets

(51) Int. Cl.
*H01L 25/11* (2006.01)
*H05K 1/02* (2006.01)

(56) References Cited

U.S. PATENT DOCUMENTS

2014/0085829 A1\* 3/2014 Yamashita ............ H01L 23/142
  361/717
2019/0096784 A1\* 3/2019 Katayama ........... H01L 23/3737

FOREIGN PATENT DOCUMENTS

| | | |
|---|---|---|
| CN | 202121502 U | 1/2012 |
| CN | 101127024 B | 3/2012 |
| CN | 202395644 U | 8/2012 |
| CN | 111540730 A | 8/2020 |
| EP | 3734813 A1 | 11/2020 |
| GB | 2271679 A | 4/1994 |
| TW | 201021669 A | 6/2010 |

\* cited by examiner

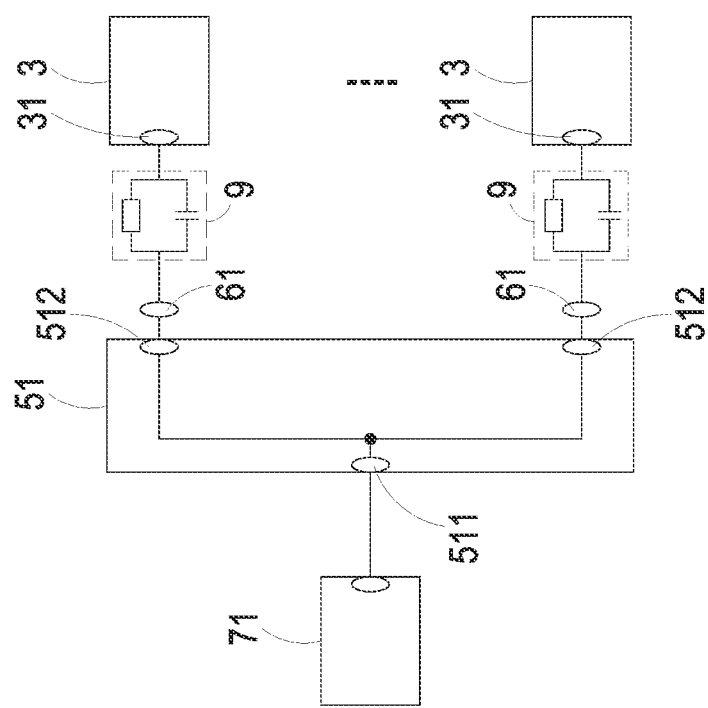

SYSTEM FOR DRIVING POWER DEVICES

CROSS-REFERENCE TO RELATED APPLICATION

This application claims priority to China Patent Application No. 202110371654.5, filed on Apr. 7, 2021, the entire contents of which are incorporated herein by reference for all purposes.

FIELD OF THE INVENTION

The present disclosure relates to a driving system, and more particularly to a system for driving power devices.

BACKGROUND OF THE INVENTION

With the development of power electronics technology in terms of larger capacity, higher power density and higher performance, the market demand for megawatt (MW) high-power converters is increasing rapidly. Restricted by current capacity limitations, concentrated heat sources and high cost, it is difficult for the conventional high-power power electronic device to satisfy large-capacity requirements. In contrast, connecting power electronic devices in parallel has the advantages of high flow capacity, uniform heat distribution, flexible layout, and high quality-price ratio. Therefore, the parallel connection technique applied to power electronic devices is more and more widely used in high-power converters.

In general, the parallel driving solution for semiconductor devices mainly includes central drive model and direct drive model. In the central drive model, as shown in FIG. 1, the control signal is transmitted through one isolation unit to drive all the parallel-connected semiconductor devices, and only one isolation unit is required in this model. In the direct drive model, as shown in FIG. 2, a plurality of isolation units respectively corresponds to a plurality of semiconductor devices for control, and the number of isolation units is the same as the number of semiconductor devices. Compared with the direct drive model, the central drive model has lower cost, simpler structure and better driving consistency, and thus the central drive model is widely used. However, in actual applications, the use of the central drive model usually requires long wires to transmit driving signals and protection signals, which may cause many problems such as insulation, electromagnetic compatibility, installation and maintenance, and these existing problems would largely reduce the reliability of system.

A system for driving ANPC (active neutral point clamped) three-level circuit topology is exemplified for explanation as follow, and the system is based on the central drive model. FIG. 3 shows the ANPC circuit topology, and FIG. 4 schematically shows the specific connection relations in the conventional system for driving power devices. As shown in FIG. 3, the ANPC circuit includes a plurality of power device modules Q1, Q2, Q3, Q4, Q5 and Q6, and each power device module includes a plurality of power devices connected in parallel. The connection relations between the power device modules Q1, Q2, Q3, Q4, Q5 and Q6 are shown in FIG. 3. It can be seen from FIG. 3 that the maximum difference between the drive line potential of the power device modules Q5 and Q6 and the drive line potential of the other power device modules equals ½Vbus, where Vbus is the bus voltage. In the power device modules Q1, Q2, Q3 and Q4, the maximum difference of drive line potential between two adjacent power device modules equals ½Vbus, and the two adjacent power device modules can be the power device modules Q1 and Q2, the power device modules Q2 and Q3, or the power device module Q3 and Q4. The maximum difference of drive line potential between two non-adjacent power device modules equals Vbus, and the two non-adjacent power device modules can be the power device modules Q1 and Q3, the power device modules Q1 and Q4, or the power device modules Q2 and Q4. As shown in FIG. 4, the multiple parallel-connected power devices in the power device module are driven based on the central drive model, and long wires are connected between the driving plate and the gate plate to transmit driving signals (represented by solid lines) and protection signals (represented by dashed lines). However, the central drive model shown in FIG. 4 may bring the following problems in actual applications.

The first problem is uncontrollable parasitic parameters. Since the sequence of arranging the long wires and the spacing between the wires are both not fixed, the parasitic parameters between the wires are uncontrollable, which may affect the consistency of driving the power devices connected in parallel. Consequently, the driving signals and protection signals transmitted by the wires may be affected, and the system reliability is decreased.

The second problem is about electromagnetic interference. Due to the parasitic capacitance between the wires, the jump in the drive line potential may be coupled to other lines through the parasitic capacitance and causes interference. Meanwhile, since the wires are long, the space occupied by the central drive model is large, which makes the driving signals susceptible to the strong magnetic field generated by the power current.

The third problem is about insulation. Since the long wires are difficult to fix, the structural stability is poor. Moreover, the spacing between the wires is small, and the insulation between two driving wires with a potential difference of Vbus is achieved by the insulated wire sheath only. The wear and tear on the wire sheath and the aging of wire sheath may cause serious safety concerns.

The other problem is the inconsistent wire specifications and the installation and maintenance issues. Due to the different positions and distances of the gate plates, the wires for driving and the wires for protection and sampling have many kinds of length specifications, and the sample preparation is difficult. In addition, it is hard to make the terminals on the driving board correspond to the terminals on the gate plate one-to-one. Therefore, the installation and arrangement sequence of wires are not fixed, the wiring is easy to be wrong, and thus the difficulty of installation and maintenance increases.

The above problems may become more serious as the number of power levels and the number of the power devices connected in parallel in the circuit increase. Further, the larger the number of power levels or the number of the power devices connected in parallel is, the longer the length of driving wires is. Consequently, the wiring also becomes more complicated. Meanwhile, the problems about electromagnetic interference and insulation are even more serious and the driving consistency is affected, which may cause hidden dangers to the circuit reliability.

Therefore, there is a need of providing a system for driving power devices in order to overcome the drawbacks of the conventional technologies.

SUMMARY OF THE INVENTION

The present disclosure provides a system for driving power devices. In this system, the driving terminals on gate plates are corresponding to the driving terminals on control board one-to-one so that the wires for connecting the driving terminals can be arranged in specific sequence and have the same length. Therefore, the parasitic parameters between the wires are controllable, and thus the consistency of driving the power devices connected in parallel and the reliability of multi-level circuit are enhanced. In addition, since the length specifications of the wires are identical, the difficulty of sample preparation, installation and maintenance decreases. Further, the wires do not need to be interlaced, thereby overcoming the problems about electromagnetic interference and insulation.

In accordance with an aspect of the present disclosure, a system for driving power devices is provided. The system for driving power devices includes a heat dissipation plate, a plurality of semiconductor modules, a plurality of gate plates, a control board, a bridge module, and a terminal module. The plurality of semiconductor modules are disposed on the heat dissipation plate. The plurality of gate plates are corresponding to the plurality of semiconductor modules one-to-one. Each of the plurality of gate plates is disposed on the corresponding semiconductor module and includes at least one first driving terminal. The control board is disposed on the heat dissipation plate. The bridge module and the terminal module are electrically connected to each other, and are disposed on the control board and arranged sequentially in a direction from a center of the control board to an edge of the control board. The bridge module includes a plurality of driving bridge plates, and each of the plurality of driving bridge plates is electrically coupled to the control board. The terminal module includes a plurality of second driving terminals, and the plurality of second driving terminals are corresponding to the first driving terminals of the plurality of gate plates one-to-one. Each of the plurality of second driving terminals is electrically connected to the corresponding driving bridge plate and first driving terminal.

The above contents of the present disclosure will become more readily apparent to those ordinarily skilled in the art after reviewing the following detailed description and accompanying drawings, in which:

BRIEF DESCRIPTION OF THE DRAWINGS

FIG. 10A, FIG. 10B and FIG. 10C schematically show different ways of matching line impedances.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
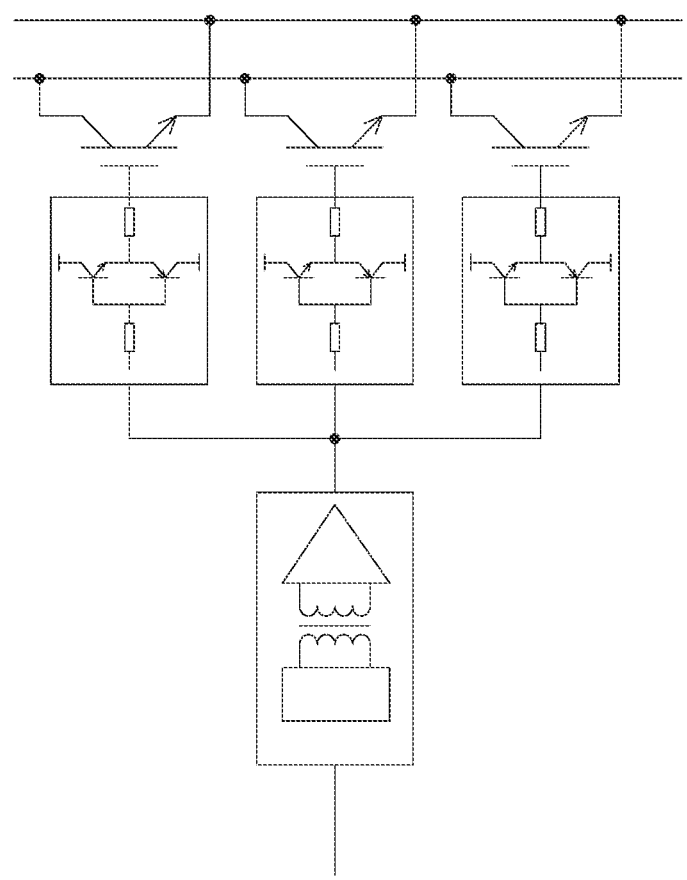
FIG. 1 is a schematic block diagram illustrating a conventional central drive model.
Figure 2:
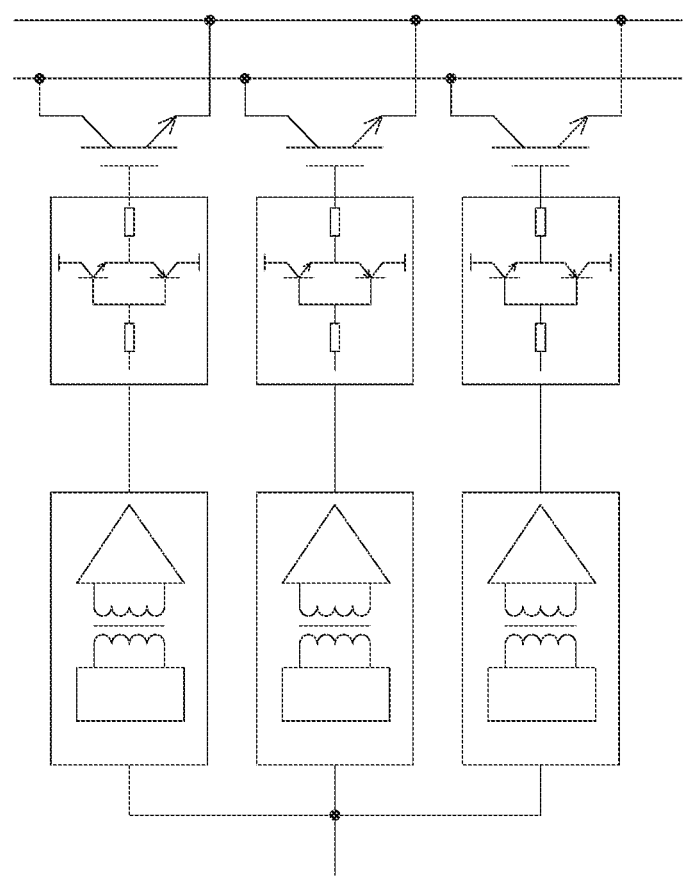
FIG. 2 is a schematic block diagram illustrating a conventional direct drive model.
Figure 3:
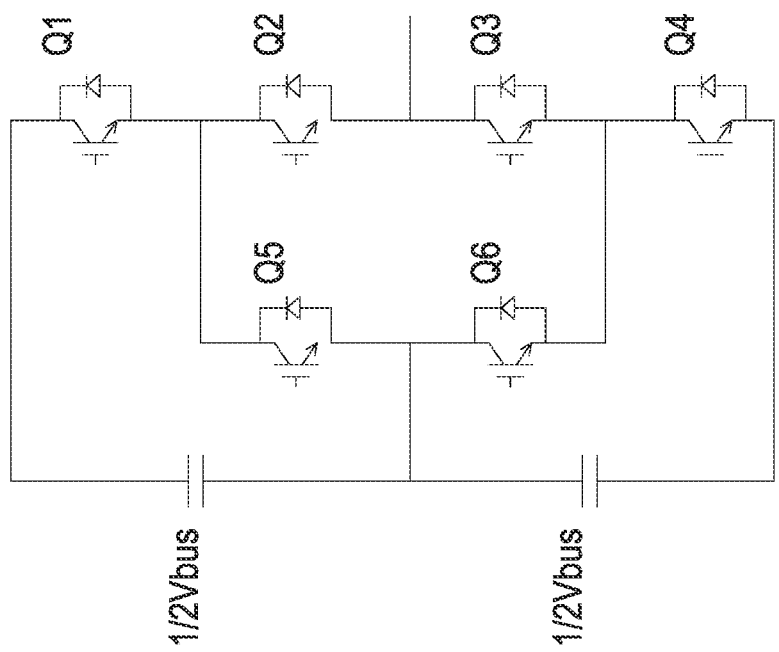
FIG. 3 is a schematic circuit diagram illustrating a conventional ANPC (active neutral point clamped) circuit topology.
Figure 4:
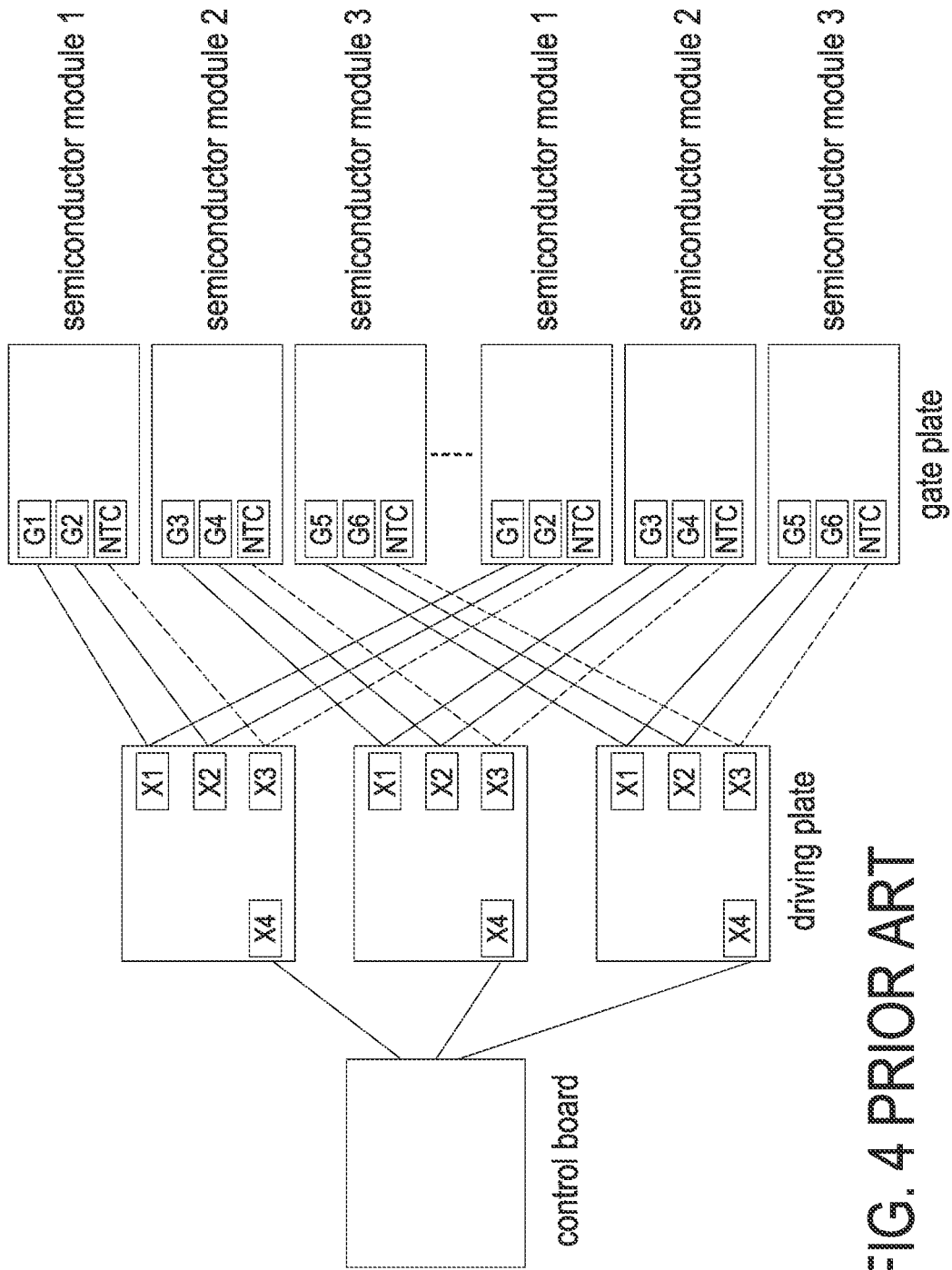
FIG. 4 is a schematic block diagram showing the specific connection relations in a conventional system for driving power devices with the central drive model.
Figure 5A:
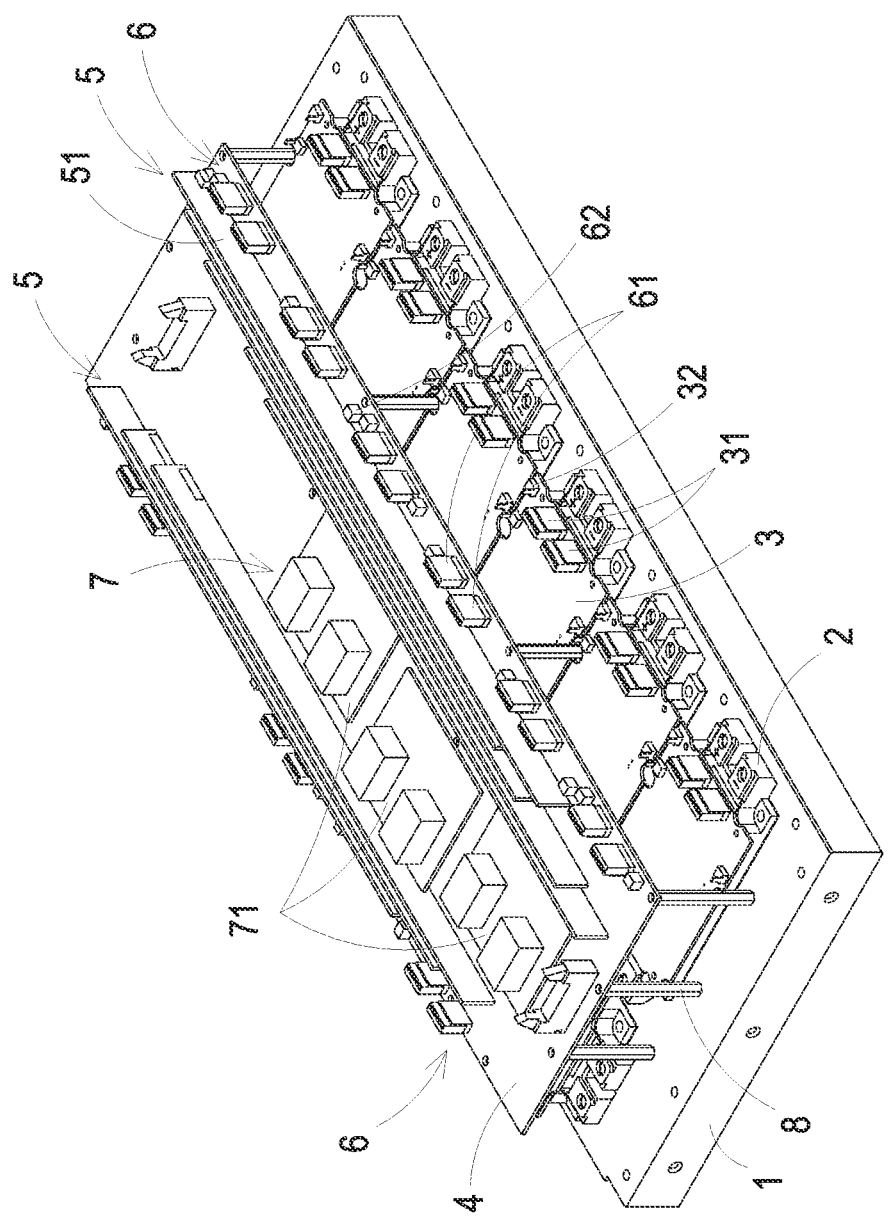
FIG. 5A is a schematic perspective view illustrating a system for driving power devices according to an embodiment of the present disclosure.
Figure 5B:
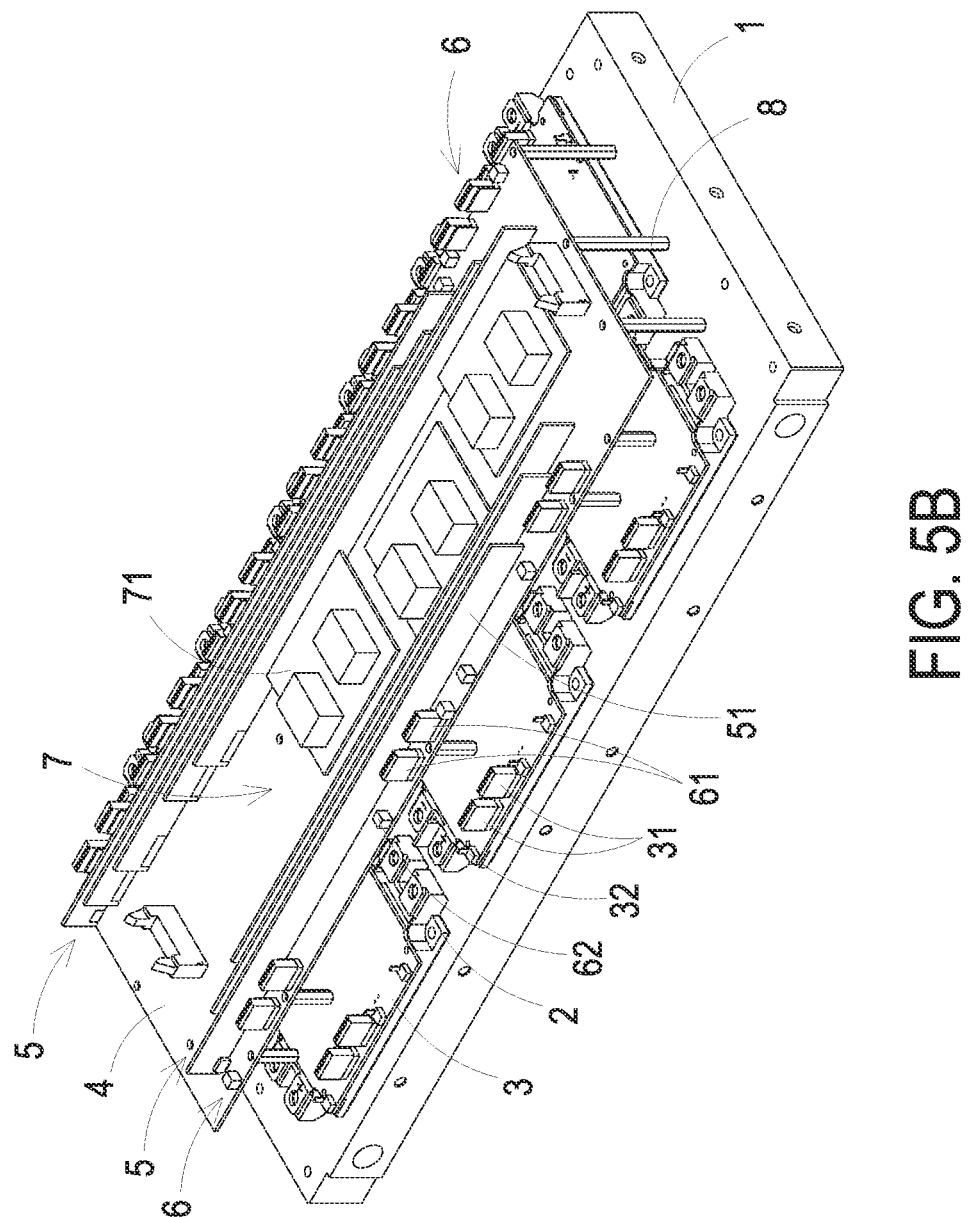
FIG. 5B is a schematic perspective view illustrating the system for driving power devices of FIG. 5A from another viewpoint.
Figure 5C:
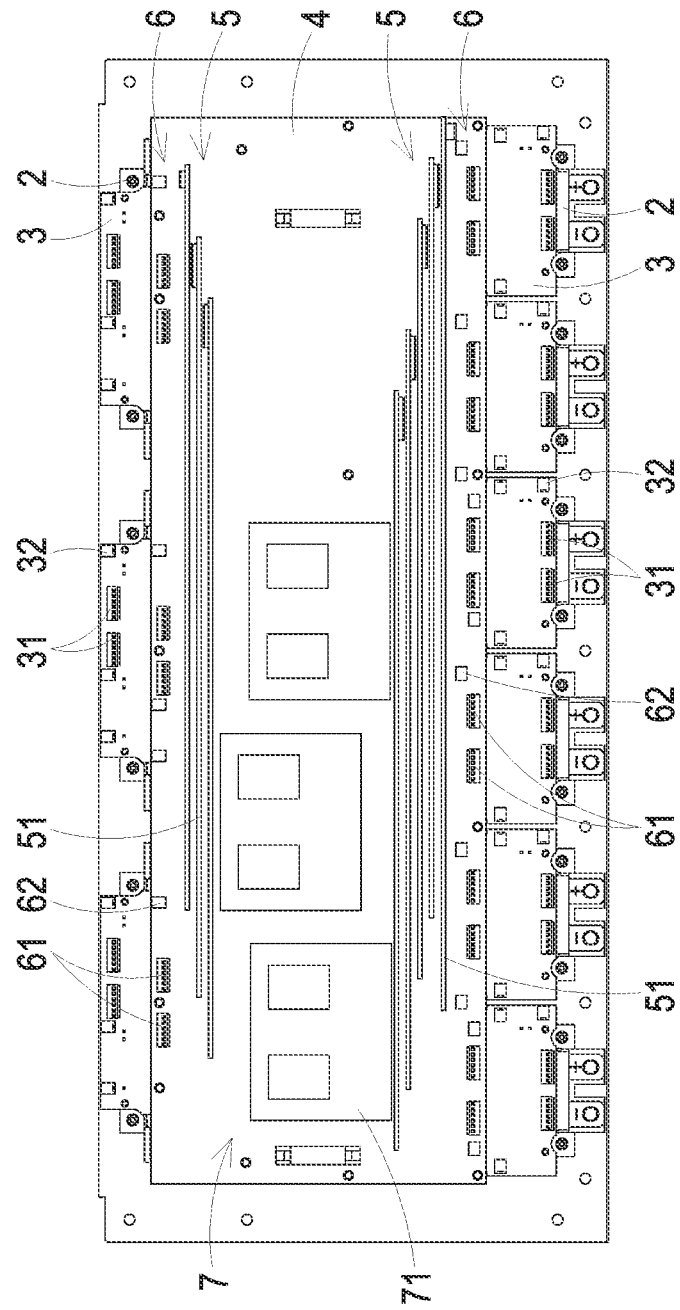
FIG. 5C schematically shows a top view of the system for driving power devices of FIG. 5A.

FIG. 5A is a schematic perspective view illustrating a system for driving power devices according to an embodiment of the present disclosure, FIG. 5B is a schematic perspective view illustrating the system for driving power devices of FIG. 5A from another viewpoint, and FIG. 5C schematically shows a top view of the system for driving power devices of FIG. 5A. As shown in FIG. 5A, FIG. 5B and FIG. 5C, the system for driving power devices includes a heat dissipation plate 1, a plurality of semiconductor modules 2, a plurality of gate plates 3, a control board 4, a bridge module 5, and a terminal module 6. The plurality of semiconductor modules 2 are disposed on the heat dissipation plate 1 and are corresponding to the plurality of gate plates 3 one-to-one. Each gate plate 3 is disposed on the corresponding semiconductor module 2 and includes at least one first driving terminal 31. The control board 4 is disposed on the heat dissipation plate 1 and is configured to provide driving signals for driving the semiconductor modules 2. The bridge module 5 and the terminal module 6 are electrically connected to each other and are both disposed on the control board 4. Further, the bridge module 5 and the terminal module 6 are arranged sequentially in a direction from the center to the edge of the control board 4. The edge of the bridge module 5 is parallel to the edge of the control board 4. The bridge module 5 includes a plurality of driving bridge plates 51, and each driving bridge plate 51 is electrically coupled to the control board 4. The terminal module 6 includes a plurality of second driving terminals 61, and the plurality of second driving terminals 61 are corresponding to all the first driving terminals 31 one-to-one. Each second driving terminal 61 is electrically connected to the corresponding driving bridge plate 51 and first driving terminal 31.

Since the first driving terminals 31 on the gate plates 3 are corresponding to the second driving terminals 61 on the control board 4 one-to-one, the wires for connecting the first driving terminal 31 and the second driving terminal 61 can be arranged in a specific sequence with the same length. Therefore, the parasitic parameters between the wires are controllable, and thus the consistency of driving the power devices connected in parallel and the reliability of multi-level circuit are enhanced. In addition, since the length specifications of the wires are identical, the difficulty of sample preparation, installation and maintenance decreases. Further, the wires do not need to be interlaced, thereby overcoming the problems about electromagnetic interference and insulation.

Figure 6:
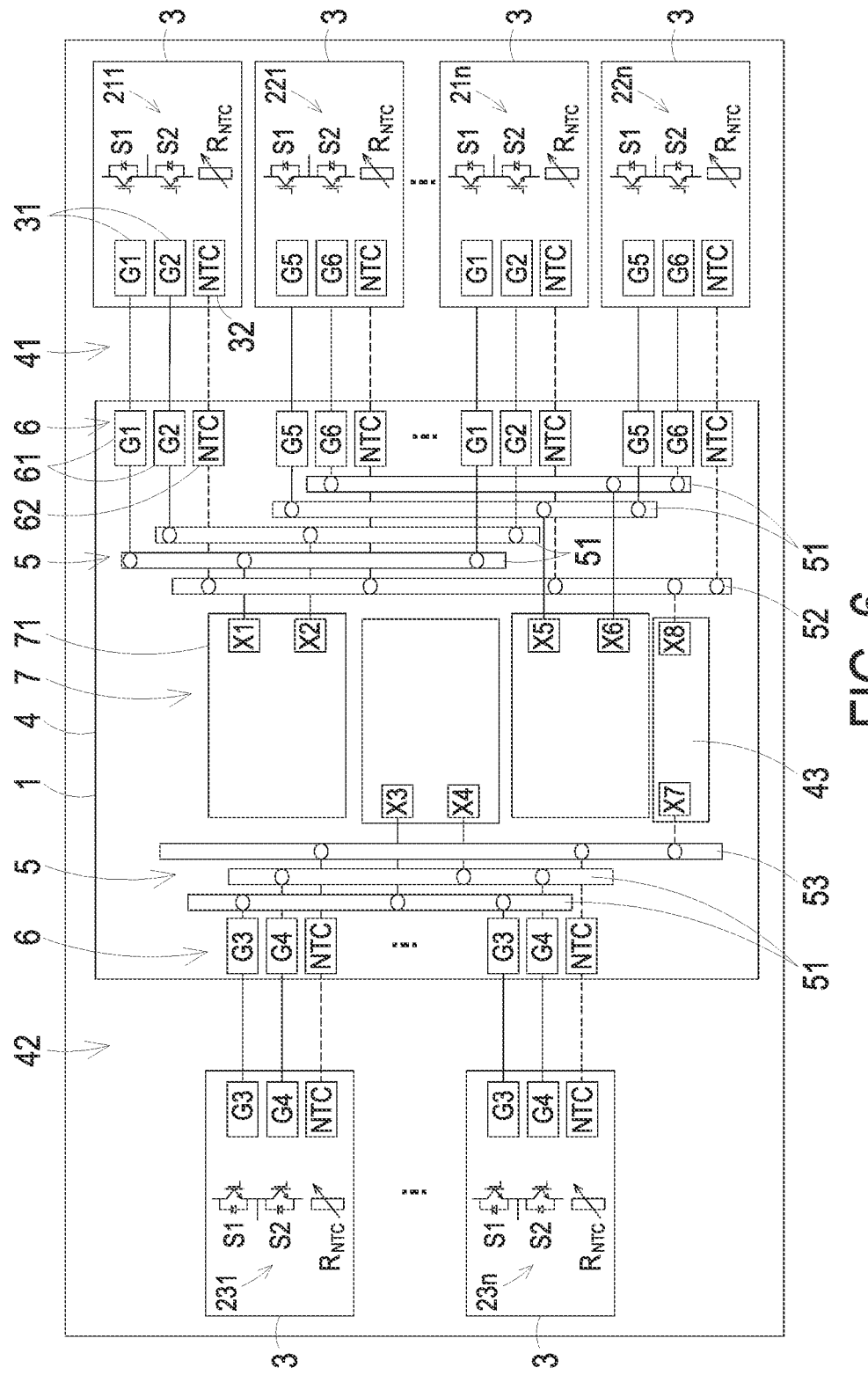
FIG. 6 is a schematic block diagram illustrating the system for driving power devices according to the embodiment of the present disclosure.
Figure 7:
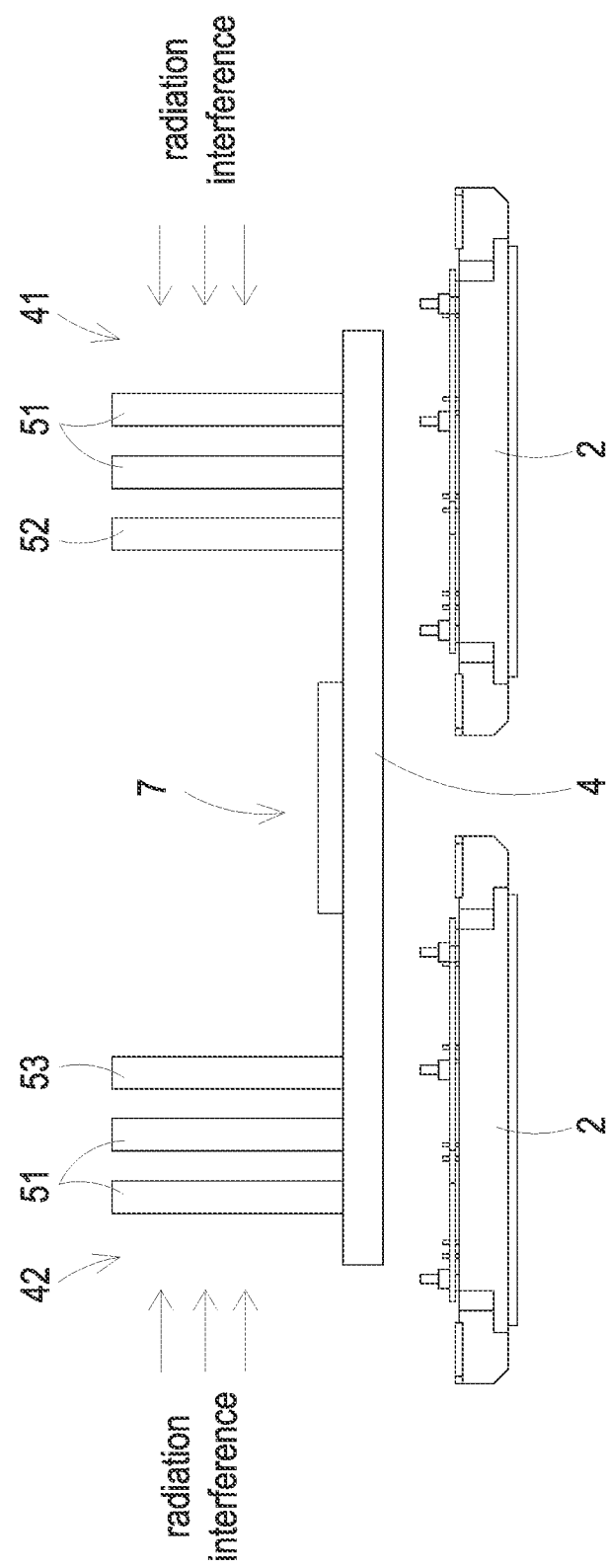
FIG. 7 schematically shows the arrangement of bridge plates.

In an embodiment, the system further includes a driving module 7 disposed on the control board 4. The driving module 7, the bridge module 5 and the terminal module 6 are arranged sequentially in the direction from the center to the edge of the control board 4. The driving module 7 includes a plurality of driving boards 71, and each driving board 71 is electrically coupled to the control board 4 and the corresponding driving bridge plate 51. For example, the driving board 71 is electrically coupled to the corresponding driving bridge plate 51 by terminal X1, X2, X3, X4, X5 and X6. As shown in FIG. 6, in this exemplary embodiment, one driving board 71 includes terminals X1 and X2, and terminals X1 and X2 are electrically connected to the corresponding driving bridge plate 51, respectively. Another driving board includes terminals X3 and X4, and the third driving board includes terminals X5 and X6. The driving board is configured to provide the driving signals for driving the semiconductor modules 2. In an embodiment, the driving module 7, the bridge module 5 and the terminal module 6 are coupled to each other through the conductive pattern on the control board 4.

FIG. 6 is a schematic block diagram illustrating the system for driving power devices according to the embodiment of the present disclosure. As shown in FIG. 6, the semiconductor modules include a plurality of first semiconductor modules 211-21n, a plurality of second semiconductor modules 221-22n and a plurality of third semiconductor modules 231-23n, where n is an integer larger than or equal to 2, and the number of the first, second and third semiconductor modules are the same. As an example, the system shown in FIG. 5A, FIG. 5B and FIG. 5C is the implementation of n equal to 3. The plurality of first semiconductor modules 211-21n are electrically connected to the plurality of second semiconductor modules 221-22n and the plurality of third semiconductor modules 231-23n respectively. Each of the first semiconductor modules 211-21n includes at least one power device, and the power devices at the corresponding position in the first semiconductor modules 211-21n are connected to each other in parallel. For example, the power devices at the corresponding position in the first semiconductor module 211, the first semiconductor module 212 to the first semiconductor module 21n are connected to each other in parallel. Each of the second semiconductor modules 221-22n includes at least one power device, and the power devices at the corresponding position in the second semiconductor modules 221-22n are connected to each other in parallel. For example, the power devices at the corresponding position in the second semiconductor module 221 to the second semiconductor module 22n are connected to each other in parallel. Each of the third semiconductor modules 231-23n includes at least one power device, and the power devices at the corresponding position in the third semiconductor modules 231-23n are connected to each other in parallel. For example, the power devices at the corresponding position in the third semiconductor module 231 to the third semiconductor module 23n are connected to each other in parallel.

As an example, each of the first semiconductor modules 211-21n includes a power device S1 and a power device S2. The power devices S1 of all the first semiconductor modules 211-21n are connected to each other in parallel, and the power devices S2 of all the first semiconductor modules 211-21n are connected to each other in parallel. Each of the second semiconductor modules 221-22n includes at least one power device, and the power devices at the corresponding position in the second semiconductor modules 221-22n are connected to each other in parallel. As an example, each of the second semiconductor modules 221-22n includes a power device S1 and a power device S2. The power devices S1 of all the second semiconductor modules 221-22n are connected to each other in parallel, and the power devices S2 of all the second semiconductor modules 221-22n are connected to each other in parallel. Each of the third semiconductor modules 231-23n includes at least one power device, and the power devices at the corresponding position in the third semiconductor modules 231-23n are connected to each other in parallel. As an example, each of the third semiconductor modules 231-23n includes a power device S1 and a power device S2. The power devices S1 of all the third semiconductor modules 231-23n are connected to each other in parallel, and the power devices S2 of all the third semiconductor modules 231-23n are connected to each other in parallel. In an embodiment, each of the first semiconductor modules 211-21n, the second semiconductor modules 221-22n and the third semiconductor modules 231-23n includes one power device. The power devices of the first semiconductor modules 211-21n are connected to each other in parallel. The power devices of the second semiconductor modules 221-22n are connected to each other in parallel. The power devices of the third semiconductor modules 231-23n are connected to each other in parallel.

In an embodiment, the parallel-connected power devices in the first semiconductor modules 211-21n are electrically coupled to the same driving bridge plate. The parallel-connected power devices in the second semiconductor modules 221-22n are electrically coupled to the same driving bridge plate. The parallel-connected power devices in the third semiconductor modules 231-23n are coupled to the same driving bridge plate.

All the first semiconductor modules 211-21n and all the second semiconductor modules 221-22n are alternately arranged on the heat dissipation plate 1 and are disposed at the first side 41 of the control board 4. Through arranging all of the first semiconductor modules 211-21n and the second semiconductor modules 221-22n alternately on the heat dissipation plate 1, the circuit loop may be shortened, the circuit inductance may be reduced, and the overall performance of the system will be enhanced. All the third semiconductor module 231-23n are arranged on the heat dissipation plate 1 in sequence and are disposed at the second side 42 of the control board 4. The second side 42 is opposite to the first side 41. A first part of the driving bridge plates 51 (i.e., the driving bridge plates 51 corresponding to the first and second semiconductor modules 211-21n and 221-22n) and a first part of the second driving terminals 61 (i.e., the second driving terminals 61 corresponding to the first and second semiconductor modules 211-21n and 221-22n) are disposed adjacent to the first side 41 of the control board 4. A second part of the driving bridge plates 51 (i.e., the driving bridge plates 51 corresponding to the third semiconductor modules 231-23n) and a second part of the second driving terminals 61 (i.e., the second driving terminals 61 corresponding to the third semiconductor modules 231-23n) are disposed adjacent to the second side 42 of the control board 4. In addition, the first part of the driving bridge plates 51 are arranged in a sequence based on the magnitude of electric potential, and the second part of the driving bridge plates 51 are arranged in a sequence based on the magnitude of electric potential, thereby reducing the electric potential difference between the adjacent driving bridge plates 51.

In an embodiment, the control board 4 includes a processing unit 43, and the bridge module 5 further includes a first protection bridge plate 52 and a second protection bridge plate 53. The first and second protection bridge plates 52 and 53 are electrically connected to the processing unit 43. For example, the first protection bridge plate 52 is electrically connected to the processing unit 43 through terminal X8, and the second protection bridge plate 53 is electrically connected to the processing unit 43 through terminal X7. The driving module 7 may be located between the first and second parts of the driving bridge plates 51, but not limited thereto. Each gate plate 3 further includes a first protection terminal 32. The terminal module 6 further includes a plurality of second protection terminals 62. All the first protection terminals 32 are corresponding to the plurality of second protection terminals 62 one-to-one. In addition, each second protection terminal 62 disposed adjacent to the first side 41 of the control board 4 is electrically connected to the corresponding first protection terminal 32 and the first protection bridge plate 52. Each second protection terminal 62 disposed adjacent to the second side 42 of the control board 4 is electrically connected to the corresponding first protection terminal 32 and the second protection bridge plate 53. In the embodiment shown in FIG. 6, the first and second protection bridge plates 52 and 53 are disposed adjacent to the first side 41 and the second side 42 of the control board 4 respectively. The second protection terminals 62, which are corresponding to the first protection terminals 32 of the gate plates 3 on the first and second semiconductor modules 211-21n and 221-22n, are electrically connected to the first protection bridge plate 52. The second protection terminals 62, which are corresponding to the first protection terminals 32 of the gate plates 3 on the third semiconductor modules 231-23n, are electrically connected to the second protection bridge plate 53. The spacing between the bridge plates can be adjusted according to actual requirements, so as to control the parasitic parameters between the wires.

In FIG. 6, the wires for connecting the first driving terminals 31 and the second driving terminals 61 are represented by solid lines, and the wires for connecting the first protection terminals 32 and the second protection terminals 62 are represented by dashed lines. The driving bridge plate 51 is configured to receive the corresponding driving signal and distribute the received driving signal into a plurality of gate driving signals. The gate driving signal is transmitted to the gate of the power device in the corresponding semiconductor module through the corresponding first driving terminal 31 and second driving terminal 61, and thus the power devices coupled to the same driving bridge plate are driven to operate synchronously. In the semiconductor modules, the gates of the parallel-connected power devices receive the gate driving signals outputted by the same driving bridge plate respectively. Therefore, in the semiconductor modules, the parallel-connected power devices are turned on or turned off synchronously. For example, the power device S1 in the first semiconductor module 211 and the power device S1 in the first semiconductor module 212 are connected to the same driving bridge plate 51 through the first driving terminals 31 and the second driving terminals 61. The driving bridge plate 51 outputs two gate driving signal to drive the power device S1 in the first semiconductor module 211 and the power device S1 in the first semiconductor module 212 to operate (e.g., turning on or off) synchronously. The power device S2 in the first semiconductor module 211 and the power device S2 in the first semiconductor module 212 are connected to the same driving bridge plate 51 through the first driving terminals 31 and the second driving terminals 61. The driving bridge plate 51 outputs two gate driving signals to drive the power device S2 in the first semiconductor module 211 and the power device S2 in the first semiconductor module 212 to operate (e.g., turning on or off) synchronously.

Moreover, in FIG. 6, the first driving terminals 31 of the gate plate 3 and the second driving terminals 61 of the terminal module 6 are represented by terminals G1, G2, G3, G4, G5 and G6. The gate driving signals which are transmitted by the first and second driving terminals 31 and 61 represented by the same symbol are the same. The distance between the first and second driving terminals 31 and 61 represented by the same symbol is equal to the same value. For example, the gate driving signals which are transmitted by the terminal G1 of the first driving terminals 31 and the terminal G1 of the second driving terminals 61 are the same, and the distance between the first and second driving terminals 31 and 61 represented by G1 is equal to the same value. In addition, all the first and second protection terminals 32 and 62 are represented by NTC. The protection signal is transmitted from the first protection terminal 32 of the gate plate 3 to the second protection terminal 62 on the control board 4 through the wire. Then, the transmitted protection signals are converged through the first and second protection bridge plates 52 and 53 and then are transmitted to the processing unit 43. In this embodiment, the thermistor $R_{NTC}$ are utilized to collect the temperature signals of the semiconductor modules, and the temperature signals are transmitted to the processing unit 43 for calculating, so as to perform the protecting operation accordingly, but not exclusively.

In an embodiment, every signal transmitted by the driving bridge plate 51, the first protection bridge plate 52 or the second protection bridge plate 53 has an interference sensitivity. The signal with lower interference sensitivity is easier to be interfered. According to a descending order of the interference sensitivity of the transmitted signals, the first part of the driving bridge plates 51 and the first protection bridge plate 52 are arranged sequentially in a direction from the center of the control board 4 to the first side 41. The second part of the driving bridge plates 51 and the second protection bridge plate 53 are arranged sequentially in a direction from the center of the control board 4 to the second side 42. The first protection bridge plate 52 is for example but not limited to be located on the inner side of the first part of the driving bridge plates 51. The second protection bridge plate 53 is for example but not limited to be located on the inner side of the second part of the driving bridge plates 51. Consequently, the signals transmitted by the bridge module 5 can be prevented from being interfered by the radiation from power lines. In an embodiment, in order to further prevent the signals transmitted by the bridge module 5 from being interfered, the system further includes a first separating plate and a second separating plate (not shown). The first separating plate is disposed between the first part of the driving bridge plates 51 and the first part of the second driving terminals 61. The second separating plate is disposed between the second part of the driving bridge plates 51 and the second part of the second driving terminals 61. The first and second separating plates both include a grounded shielding layer for preventing the signals transmitted by the bridge module 5 from being interfered.

In above embodiments, the semiconductor modules 2 are disposed at the two sides of the control board 4, but the present disclosure is not limited thereto. In an embodiment, the semiconductor modules 2 may be disposed at one side of the control board 4. As exemplified in FIG. 8, in this embodiment, all the semiconductor modules 2 include a plurality of first semiconductor modules 211, 212, . . . , 21n and a plurality of second semiconductor modules 221, 222, ..., 22n, and the number of the first semiconductor modules and the number of the second semiconductor modules are the same. Each of the first semiconductor modules 211, 212, ..., 21n and the second semiconductor modules 221, 222, ..., 22n includes at least one power device. The power devices at the corresponding position in the first semiconductor modules 211, 212, ..., 21n are connected to each other in parallel, and the power devices at the corresponding position in the second semiconductor modules 221, 222, ..., 22n are connected to each other in parallel. For example, each of the first semiconductor modules 211, 212, ..., 21n includes a power device S1 and a power device S2. The power devices S1 of the first semiconductor modules 211, 212, ..., 21n are connected to each other in parallel, and the power devices S2 of the first semiconductor modules 211, 212, ..., 21n are connected to each other in parallel. Likewise, each of the second semiconductor modules 221, 222, ..., 22n includes a power device S1 and a power device S2. The power devices S1 of the second semiconductor modules 221, 222, ..., 22n are connected to each other in parallel, and the power devices S2 of the second semiconductor modules 221, 222, ..., 22n are connected to each other in parallel. All the first semiconductor modules 211-21n and all the second semiconductor modules 221-22n are alternately arranged on the heat dissipation plate 1 and are disposed at the first side 41 of the control board 4. Through arranging all of the first semiconductor modules 211-21n and the second semiconductor modules 221-22n alternately on the heat dissipation plate 1, the circuit loop may be shortened, the loop inductance may be reduced, and the overall performance of the system will be enhanced. All the driving bridge plates 51 and all the second driving terminals 61 are disposed adjacent to the first side 41 of the control board 4. The driving bridge plates 51 are arranged in a sequence based on the magnitude of electric potential. The control board 4 includes a processing unit 3, and the bridge module 5 further includes a first protection bridge plate 52. The first protection bridge plate 52 is electrically connected to the processing unit 43. The terminal module 6 further includes a plurality of second protection terminals 62, and each gate plate 3 further includes a first protection terminal 32. All the first protection terminals 32 are corresponding to all the second protection terminals 62 one-to-one. In addition, each second protection terminal 62 is electrically connected to the corresponding first protection terminal 32 and the first protection bridge plate 52. Each signal transmitted by the driving bridge plate 51 or the first protection bridge plate has an interference sensitivity. According to a descending order of the interference sensitivity, the driving bridge plates 51 and the first protection bridge plate 52 are arranged sequentially in a direction from the center of the control board 4 to the first side 41. In an embodiment, in order to further prevent the signals transmitted by the bridge module 5 from being interfered, the system further includes a first separating plate (not shown) disposed between the bridge module 5 and the terminal module 6. The first separating plate includes a grounded shielding layer for preventing the signals transmitted by the bridge module 5 from being interfered.

Compared with the conventional system for driving power devices, in the system for driving power devices of the present disclosure, the areas of the driving loop in parallel are all greatly reduced, thereby reducing the interference from the power loop to the driving signals. Moreover, through shortening the distance between the first driving terminal 31 and the second driving terminal 61 and shortening the distance between the first protection terminal 32 and the second protection terminal 62, the areas of the driving loops in parallel are further reduced.

Figure 8:
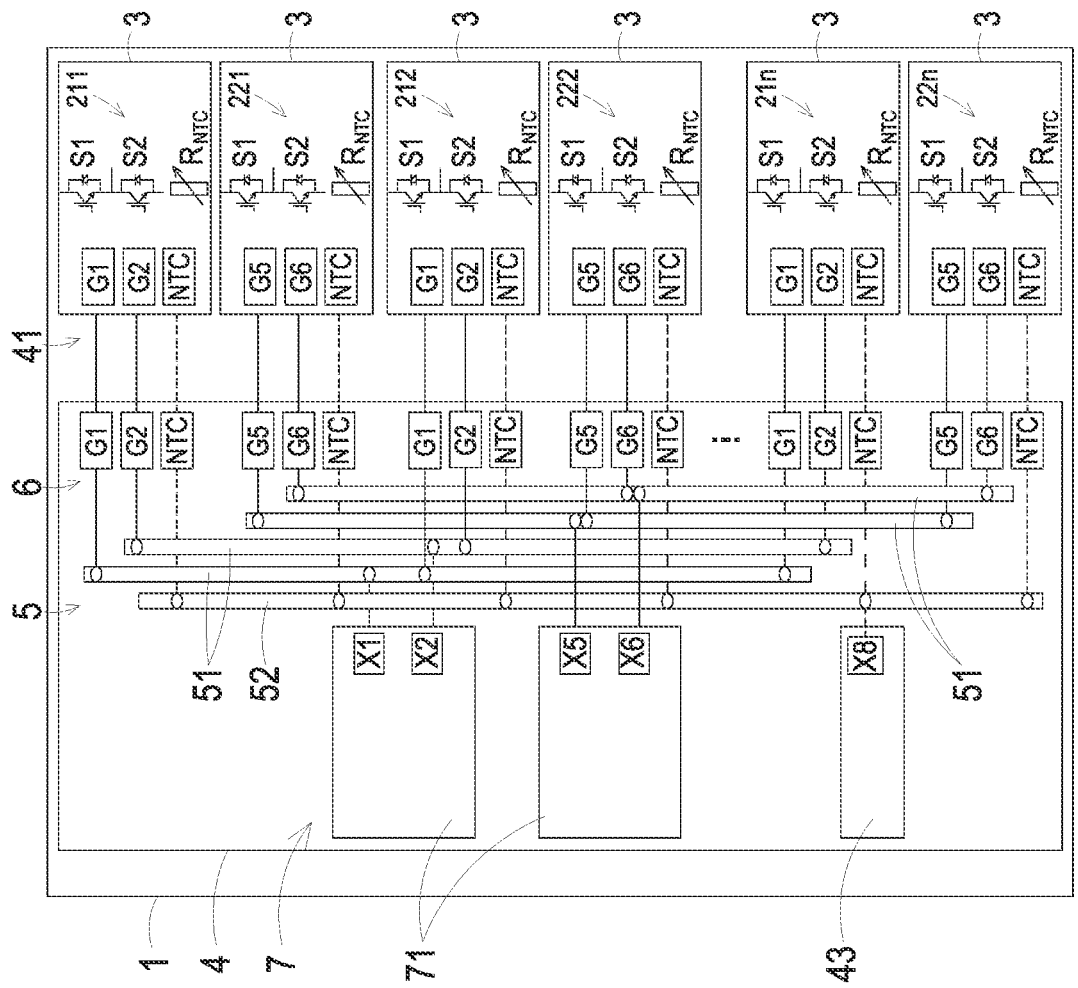
FIG. 8 is a schematic block diagram illustrating a system for driving power devices according to another embodiment of the present disclosure.
Figure 9:
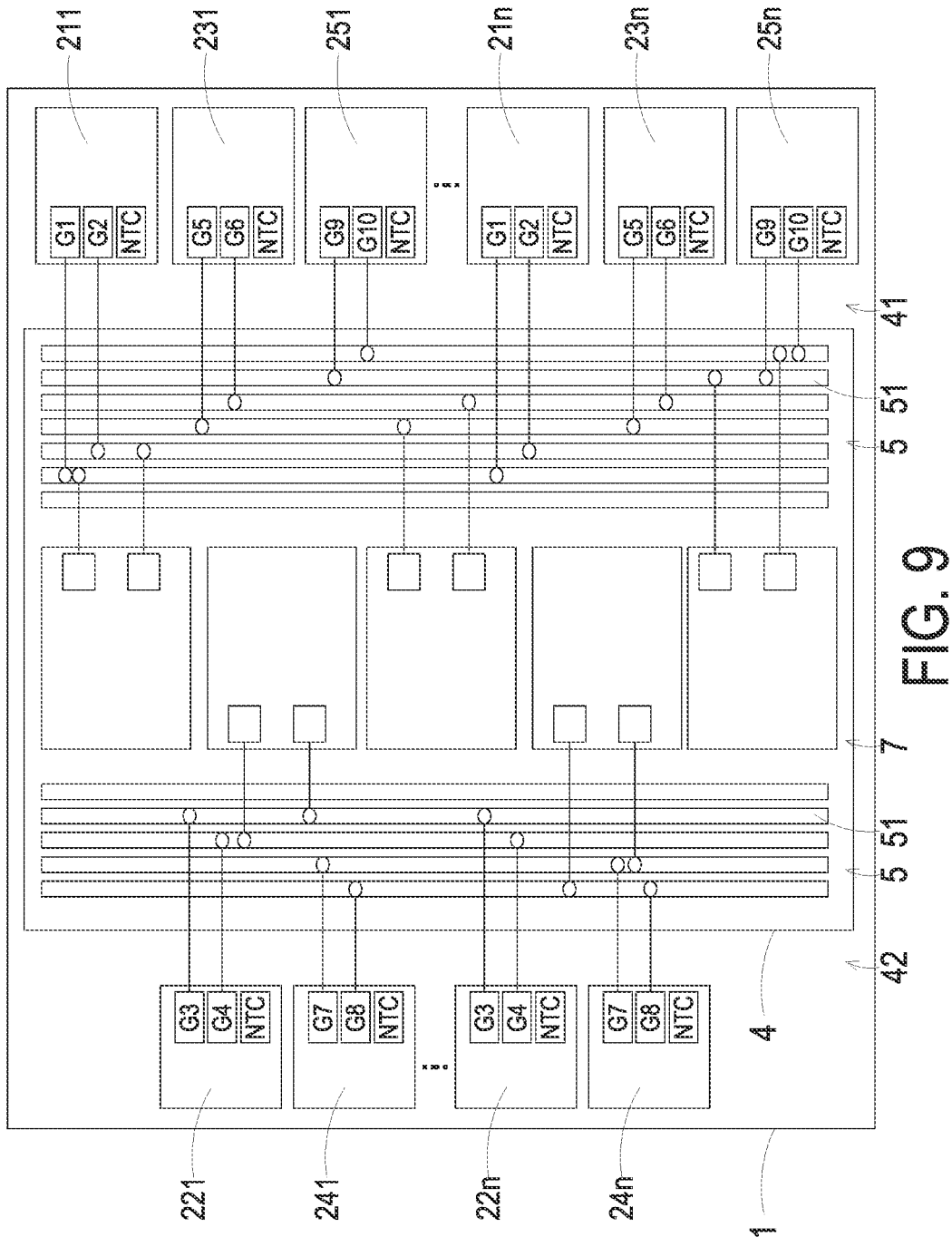
FIG. 9 is a schematic block diagram illustrating a system for driving power devices according to further another embodiment of the present disclosure.

As shown in FIG. 6, three semiconductor modules are not connected in parallel, such as the first semiconductor module, the second semiconductor module and the third semiconductor module. As shown in FIG. 8, two semiconductor modules are not connected in parallel, such as the first semiconductor module and the second semiconductor module. However, in the system of the present disclosure, the number of the semiconductor modules without being connected in parallel is not limited to 2 or 3, and the number can be adjusted according actual circuit topology. FIG. 9 is a schematic block diagram illustrating a system for driving power devices in the case of five semiconductor modules without being connected in parallel. As shown in FIG. 9, the semiconductor modules include a plurality of first semiconductor modules 211, 212, ..., 21n, a plurality of second semiconductor modules 221, 222, ..., 22n, a plurality of third semiconductor modules 231, 232, ..., 23n, a plurality of fourth semiconductor modules 241, 242, ..., 24n, and a plurality of fifth semiconductor modules 251, 252, ..., 25n. Each of the first semiconductor modules 211, 212, ..., 21n, the second semiconductor modules 221, 222, ..., 22n, the third semiconductor modules 231, 232, ..., 23n, the fourth semiconductor modules 241, 242, ..., 24n, and the fifth semiconductor modules 251, 252, ..., 25n includes at least one power device. The power devices at the corresponding position in the first semiconductor modules 211, 212, ..., 21n are connected to each other in parallel. The power devices at the corresponding position in the second semiconductor modules 221, 222, ..., 22n are connected to each other in parallel. The power devices at the corresponding position in the third semiconductor modules 231, 232, ..., 23n are connected to each other in parallel. The power devices at the corresponding position in the fourth semiconductor modules 241, 242, ..., 24n are connected to each other in parallel. The power devices at the corresponding position in the fifth semiconductor modules 251, 252, ..., 25n are connected to each other in parallel. All the first semiconductor modules 211, 212, ..., 21n, all the third semiconductor modules 231, 232, ..., 23n, and all the fifth semiconductor modules 251, 252, ..., 25n are alternately arranged on the heat dissipation plate 1 and are disposed at the first side 41 of the control board 4. All the second semiconductor modules 221, 222, ..., 22n and all the fourth semiconductor modules 241, 242, ..., 24n are alternately arranged on the heat dissipation plate 1 and are disposed at the second side 42 of the control board 4. A first part of the driving bridge plates 51 (i.e., the driving bridge plates 51 corresponding to the first, third and fifth semiconductor modules) and a first part of the second driving terminals (omitted in FIG. 9 for simplifying the figure) are disposed adjacent to the first side 41 of the control board 4. A second part of the driving bridge plates 51 (i.e., the driving bridge plates 51 corresponding to the second and fourth semiconductor modules) and a second part of the second driving terminals are disposed adjacent to the second side 42 of the control board 4.

Figure 10B:
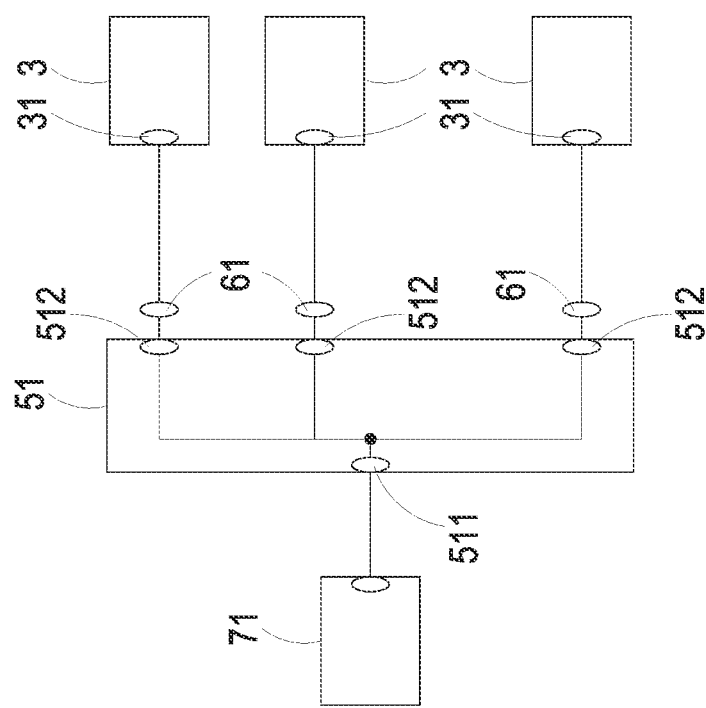
Figure 10C:
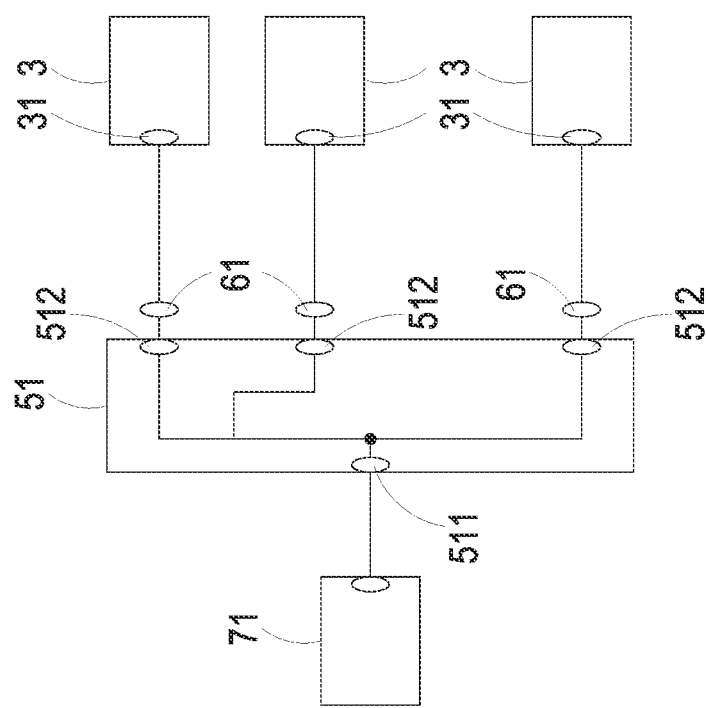

Moreover, since the driving signals are distributed by the driving bridge plates 51 and then outputted to the semiconductor modules, the impedance of the transmission paths that transmit the same gate driving signal needs to be the same so as to improve the driving consistency. As shown in FIG. 10A, each driving bridge plate 51 has a first terminal 511 and a plurality of second terminals 512. The first terminal 511 is coupled to the control board 4. The plurality of second terminals 512 are connected to the corresponding second driving terminals 61 respectively, and thus each second terminal 512 can be connected to the gate of the power device in the corresponding semiconductor module through the corresponding first driving terminal 31 and second driving terminal 61. In this embodiment, in the transmission path, by disposing the impedance circuit 9, the impedance on the path between the first terminal 511 of the driving bridge plate 51 and gate of any power device coupled to this driving bridge plate 51 is equal. The impedance circuit 9 may be formed by resistor and capacitor, but not limited thereto, and the impedance circuit 9 is for example but not limited to be disposed on the control board 4 or gate plate 3. In an embodiment, in each driving bridge plate 51, the impedance on path between the first terminal 511 and any second driving terminal 61 is equal. When the wire between the corresponding first driving terminal 31 and second driving terminal 61 of each phase is consistent, the impedance matching can be realized by adjusting the PCB trace on the driving bridge plate 51. Two ways of adjusting the PCB trace are exemplified in FIG. 10B and FIG. 10C, but the actual application is not limited thereto. As shown in FIG. 10B, the impedance matching is realized by adjusting the width of the PCB trace on the driving bridge plate 51. As shown in FIG. 10C, the impedance matching is realized by adjusting the length of the trace on the driving bridge plate 51. Of course, in actual application, one or more of the ways of disposing the impedance circuit and adjusting the width and length of trace can be individually taken or combined to make the impedance on each transmission path consistent.

Please refer to FIG. 5A and FIG. 5B again. In an embodiment, the system further includes a plurality of supporting brackets, which are assembled between the control board 4 and the heat dissipation plate 1 to form a gap between the control board 4 and the heat dissipation plate 1. The semiconductor modules 2 are located between the control board 4 and the heat dissipation plate 1.

In addition, in order to further prevent the signals transmitted by the bridge module 5 from being interfered, a grounded shielding layer may be disposed on the control board 4 and/or the driving bridge plate 51.

In an embodiment, the PCB trace on the driving bridge plate 51 is disposed on the same side of the driving bridge plate 51, and the trace on adjacent driving bridge plates 51 may be insulated by air insulation. Furthermore, in order to improve the insulation between the adjacent driving bridge plates, each driving bridge plate uses multi-layer plate for solid insulation, but not limited thereto.

The present disclosure provides a system for driving power devices. In this system, the driving terminals on gate plates are corresponding to the driving terminals on control board one-to-one, and the distance between the first and second driving terminals coupled to the power devices connected in parallel is equal. Therefore, the wires for connecting the driving terminals can be arranged in specific sequence and have the same length. Consequently, the parasitic parameters between the wires are controllable, and thus the consistency of driving the power devices connected in parallel and the reliability of multi-level circuit are enhanced. Since the length specifications of the wires are identical, the difficulty of sample preparation, installation and maintenance decreases. Moreover, the wires do not need to be interlaced, thereby overcoming the problems about electromagnetic interference and insulation. In addition, the driving bridge plates are arranged in a sequence based on the magnitude of electric potential, thereby reducing the electric potential difference between the adjacent driving bridge plates. Further, according to a descending order of the interference sensitivity, the bridge plates are arranged sequentially in a direction from the center to the edge of the control board, so as to prevent the signals transmitted by the bridge module from being interfered by the radiation from power lines. In order to further prevent the signals transmitted by the bridge module from being interfered, the separating plate is disposed, or the grounded shielding layer is disposed on the control board or driving bridge plate. The trace on the driving bridge plates may be disposed on the same side so that the insulation between the driving bridge plates is improved. In addition, one or more of the ways of disposing the impedance circuit and adjusting the width and length of trace can be individually taken or combined to make the impedance on each transmission path consistent, thereby improving the driving consistency.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A system for driving power devices, comprising:
   a heat dissipation plate;
   a plurality of semiconductor modules, disposed on the heat dissipation plate;
   a plurality of gate plates, corresponding to the plurality of semiconductor modules one-to-one, wherein each of the plurality of gate plates is disposed on the corresponding semiconductor module and comprises at least one first driving terminal;
   a control board, disposed on the heat dissipation plate; and
   a bridge module and a terminal module electrically connected to each other, disposed on the control board and arranged sequentially in a direction from a center of the control board to an edge of the control board, wherein the bridge module comprises a plurality of driving bridge plates, each of the plurality of driving bridge plates is electrically coupled to the control board, and the terminal module comprises a plurality of second driving terminals, and the plurality of second driving terminals are corresponding to the first driving terminals of the plurality of gate plates one-to-one, and each of the plurality of second driving terminals is electrically connected to the corresponding driving bridge plate and first driving terminal.

2. The system according to claim 1, further comprising a driving module disposed on the control board, wherein the driving module, the bridge module and the terminal module are arranged sequentially in the direction from the center of the control board to the edge of the control board, and the driving module comprises a plurality of driving plates, each of the plurality of driving plates is electrically coupled to the control board and the corresponding driving bridge plate, and the plurality of driving plates are configured to provide the driving signals for driving the plurality of semiconductor modules.

3. The system according to claim 2, wherein the driving module, the bridge module and the terminal module are electrically coupled to each other through a conductive pattern on the control board.

4. The system according to claim 1, wherein the plurality of semiconductor modules comprises a plurality of first semiconductor modules and a plurality of second semiconductor modules, and the plurality of first semiconductor modules are electrically connected to the plurality of second semiconductor modules, each of the plurality of first semiconductor modules comprises at least one power device, the power devices at the corresponding position in the plurality of the first semiconductor modules are electrically connected to each other in parallel, each of the plurality of second semiconductor modules comprises at least one power device, and the power devices at the corresponding position in the plurality of the second semiconductor modules are electrically connected to each other in parallel.

5. The system according to claim 4, wherein the parallel-connected power devices in the plurality of the first semiconductor modules or in the plurality of the second semiconductor modules are electrically coupled to the same driving bridge plate through the corresponding first driving terminals and second driving terminals.

6. The system according to claim 4, wherein the plurality of first semiconductor modules and the plurality of second semiconductor modules are alternately arranged on the heat dissipation plate and are disposed at a first side of the control board.

7. The system according to claim 6, wherein the plurality of driving bridge plates and the plurality of second driving terminals are disposed adjacent to the first side of the control board.

8. The system according to claim 4, wherein the control board comprises a processing unit, and the bridge module further comprises a first protection bridge plate electrically connected to the processing unit, each of the plurality of gate plates further comprises a first protection terminal, the terminal module further comprises a plurality of second protection terminals, all of the first protection terminals are corresponding to the plurality of second protection terminals one-to-one, and each of the plurality of second protection terminals is electrically connected to the first protection bridge plate and the corresponding first protection terminal.

9. The system according to claim 8, wherein the signal transmitted by the plurality of driving bridge plates and the first protection bridge plate has an interference sensitivity, according to a descending order of the interference sensitivity of transmitted signals, the plurality of the driving bridge plates and the first protection bridge plate are arranged sequentially in a direction from the center of the control board to a first side of the control board.

10. The system according to claim 4, wherein the plurality of driving bridge plates are arranged in a sequence based on the magnitude of electric potential.

11. The system according to claim 4, further comprising a first separating plate disposed between the bridge module and the terminal module, wherein the first separating plate comprises a grounded shielding layer configured for preventing signals transmitted by the bridge module from being interfered.

12. The system according to claim 1, wherein the plurality of semiconductor modules comprises a plurality of first semiconductor modules, a plurality of second semiconductor modules and a plurality of third semiconductor modules, the plurality of first semiconductor modules are electrically connected to the plurality of second semiconductor modules and the plurality of third semiconductor modules respectively, and each of the plurality of first semiconductor modules comprises at least one power device, the power devices at the corresponding position in the first semiconductor modules are electrically connected to each other in parallel, each of the plurality of second semiconductor modules comprises at least one power device, the power devices at the corresponding position in the second semiconductor modules are electrically connected to each other in parallel, each of the plurality of third semiconductor modules comprises at least one power device, and the power devices at the corresponding position in the third semiconductor modules are electrically connected to each other in parallel.

13. The system according to claim 12, wherein the plurality of first semiconductor modules and the plurality of second semiconductor modules are alternately arranged on the heat dissipation plate and are disposed at a first side of the control board, and the plurality of third semiconductor modules are arranged on the heat dissipation plate and are disposed at a second side of the control board, and the second side is opposite to the first side.

14. The system according to claim 13, wherein a first part of the plurality of driving bridge plates and a first part of the plurality of second driving terminals are disposed adjacent to the first side of the control board, and a second part of the plurality of driving bridge plates and a second part of the plurality of second driving terminals are disposed adjacent to the second side of the control board.

15. The system according to claim 14, wherein the control board comprises a processing unit, the bridge module further comprises a first protection bridge plate and a second protection bridge plates, the first protection bridge plate and the second protection bridge plates are electrically connected to the processing unit, each of the plurality of gate plates further comprises a first protection terminal, the terminal module further comprises a plurality of second protection terminals, all of the first protection terminals are corresponding to the plurality of second protection terminals one-to-one, and each of the plurality of second protection terminals is electrically connected to the corresponding first protection terminal and the corresponding first or second protection bridge plate.

16. The system according to claim 15, wherein the signal transmitted by the plurality of driving bridge plates, the first protection bridge plate and the second protection bridge plate has an interference sensitivity, according to a descending order of the interference sensitivity of transmitted signals, the first part of the plurality of the driving bridge plates and the first protection bridge plate are arranged sequentially in a direction from the center of the control board to the first side of the control board, and the second part of the plurality of the driving bridge plates and the second protection bridge plate are arranged sequentially in a direction from the center of the control board to the second side of the control board.

17. The system according to claim 14, wherein the first part of the plurality of driving bridge plates are arranged in a sequence based on the magnitude of electric potential, and the second part of the plurality of driving bridge plates are arranged in a sequence based on the magnitude of electric potential.

18. The system according to claim 14, further comprising a first separating plate and a second separating plate, wherein the first separating plate is disposed between the first part of the plurality of driving bridge plates and the first part of the plurality of second driving terminals, and the second separating plate is disposed between the second part of the plurality of driving bridge plates and the second part of the plurality of second driving terminals, both the first separating plate and the second separating plate comprise a grounded shielding layer configured for preventing signals transmitted by the bridge module from being interfered.

19. The system according to claim 1, wherein the driving bridge plate is configured to receive the corresponding driving signal and distribute the received driving signal into a plurality of gate driving signals, so as to drive power devices coupled to the same driving bridge plate to operate synchronously.

20. The system according to claim 1, wherein each of the plurality of driving bridge plates has a first terminal and a plurality of second terminals, and the first terminal is electrically coupled to the control board, and the plurality of second terminals are electrically connected to the corresponding second driving terminals respectively.

21. The system according to claim 20, wherein in each of the plurality of driving bridge plates, an impedance on a path between the first terminal and any of the corresponding second driving terminals is equal.

22. The system according to claim 20, wherein in each of the plurality of driving bridge plates, an impedance on a path between the first terminal and a gate of any power device coupled to the driving bridge plate is equal.

23. The system according to claim 1, further comprising a plurality of supporting brackets, wherein the plurality of supporting brackets are assembled between the control board and the heat dissipation plate to form a gap therebetween, and the plurality of semiconductor modules are located between the control board and the heat dissipation plate.

24. The system according to claim 1, wherein the first driving terminals is electrically connected to the corresponding second driving terminals through wire.

25. The system according to claim 1, wherein an edge of the bridge module is parallel to an edge of the control board.

26. The system according to claim 1, wherein the control board comprises a grounded shielding layer configured to prevent signals transmitted by the bridge module from being interfered.

27. The system according to claim 1, wherein each of the plurality of driving bridge plates comprises a plurality of traces, and the plurality of traces are disposed on a first side plane of the corresponding driving bridge plates respectively.

28. The system according to claim 1, wherein each of the plurality of driving bridge plates comprises a grounded shielding layer configured to prevent signals transmitted by the bridge module from being interfered.

* * * * *